US012213254B2

(12) United States Patent
Liu

(10) Patent No.: US 12,213,254 B2
(45) Date of Patent: Jan. 28, 2025

(54) MULTI-LAYER PRINTED CIRCUIT BOARD

(71) Applicant: JESS-LINK PRODUCTS CO., LTD., New Taipei (TW)

(72) Inventor: Yu-Liang Liu, New Taipei (TW)

(73) Assignee: JESS-LINK PRODUCTS CO., LTD., New Taipei (TW)

(*) Notice: Subject to any disclaimer, the term of this patent is extended or adjusted under 35 U.S.C. 154(b) by 227 days.

(21) Appl. No.: 17/829,319

(22) Filed: May 31, 2022

(65) Prior Publication Data
US 2023/0292437 A1 Sep. 14, 2023

(51) Int. Cl.
*H05K 1/11* (2006.01)
*H05K 1/02* (2006.01)
*H05K 1/18* (2006.01)

(52) U.S. Cl.
CPC ........... *H05K 1/115* (2013.01); *H05K 1/0298* (2013.01); *H05K 1/112* (2013.01); *H05K 1/0271* (2013.01); *H05K 1/181* (2013.01); *H05K 2201/09563* (2013.01); *H05K 2201/09609* (2013.01); *H05K 2201/0969* (2013.01); *H05K 2201/09854* (2013.01)

(58) Field of Classification Search
CPC ................. H05K 1/115; H05K 1/0298; H05K 2201/09563; H05K 2201/09609; H05K 2201/09854; H05K 1/0271; H05K 2201/062; H05K 2201/0969; H05K 1/116
See application file for complete search history.

(56) References Cited

U.S. PATENT DOCUMENTS 6,646,886 B1 * 11/2003 Popovich ............. H05K 1/0265
361/795
7,544,899 B2 * 6/2009 Kamada ............... H05K 1/0201
174/262
8,106,303 B2 * 1/2012 Ishida ................. H05K 1/0201
174/260
9,860,975 B2 * 1/2018 Kapoor ............... H05K 1/0243
2019/0200450 A1 6/2019 Mellitz et al.
2019/0208630 A1 7/2019 Mandelboum et al.

FOREIGN PATENT DOCUMENTS

TW M611951 U 5/2021

OTHER PUBLICATIONS

Office Action dated Feb. 10, 2023 of the corresponding Taiwan patent application No. 111109159.

* cited by examiner

*Primary Examiner* — Ishwarbhai B Patel
(74) *Attorney, Agent, or Firm* — Chun-Ming Shih; HDLS IPR SERVICES

(57) ABSTRACT

A multi-layer printed circuit board includes a base-layer metal, multiple middle metal layers and a top-layer metal. The middle metal layers are stacked on the base-layer metal sequentially. The top-layer metal is disposed on the middle metal layers. The base-layer metal, each middle metal layer and the top-layer metal are formed with multiple through holes respectively. Part of the middle metal layers are separately formed with multiple hole groups corresponding to the through holes. Each hole group includes multiple passing holes. The passing holes jointly surround a corresponding one of the through holes to form multiple connecting channels. Therefore, the multi-layer printed circuit board may reduce the cooling speed of the through holes to avoid an excessively low temperature of a pad to affect the soldering efficiency with keeping the high-frequency transmission and the signal isolation.

9 Claims, 6 Drawing Sheets

MULTI-LAYER PRINTED CIRCUIT BOARD

BACKGROUND

Technical Field

The disclosure relates to a circuit board, particularly to a multi-layer printed circuit board which may reduce the cooling speed of a pad to improve the soldering efficiency.

Related Art

With the advance of printed circuit boards (PCB) and the manufacturing process of electronic components, the design of PCBs also progressively tends to high speed and compactness to satisfy the requirements of high performance and lightweight of electronic products. To reduce the size of a PCB, a layout design of multi-layer PCB is proposed to add the wiring area.

Generally speaking, to avoid the crosstalk interference between high-speed signals, a multi-layer PCB is usually disposed with via holes to isolate signals to reduce the influence. However, holing a pad may make the cooling speed of the pad excessively fast to cause an insufficient soldering temperature in the subsequent soldering process, so as to affect the processing efficiency and the yield rate of soldering.

In view of this, the inventors have devoted themselves to the above-mentioned related art, researched intensively and cooperated with the application of science to try to solve the above-mentioned problems. Finally, the invention which is reasonable and effective to overcome the above drawbacks is provided.

SUMMARY

An object of the disclosure is to make the multi-layer printed circuit board reduce the cooling speed of the through holes to avoid an excessively low temperature of a pad to affect the soldering efficiency with keeping the high-frequency transmission and the signal isolation.

To accomplish the above object, the disclosure provides a multi-layer printed circuit board, which includes a base-layer metal, multiple middle metal layers and a top-layer metal. The middle metal layers are stacked on the base-layer metal in order. The top-layer metal is disposed on the middle metal layers. The base-layer metal, each of the middle metal layers and the top-layer metal are formed with multiple through holes respectively. Part of the middle metal layers are separately formed with multiple hole groups corresponding to the through holes. Each hole group includes multiple passing holes. The passing holes jointly surround a corresponding one of the through holes to form multiple connecting channels.

The disclosure further has the following functions. The base-layer metal, each middle metal layer and the top-layer metal are formed with multiple through holes to generate signal isolation to reduce the crosstalk interference between high-frequency signals. The passing holes around the through hole may decrease the conductive area around the through hole to reduce the cooling speed to avoid an excessively low temperature of a pad and to be advantageous to the subsequent soldering process. By adjusting the numbers of the passing holes and the connecting channels of the hole group, the cooling speed around the through holes may be increased or decreased.

DETAILED DESCRIPTION

Figure 1:
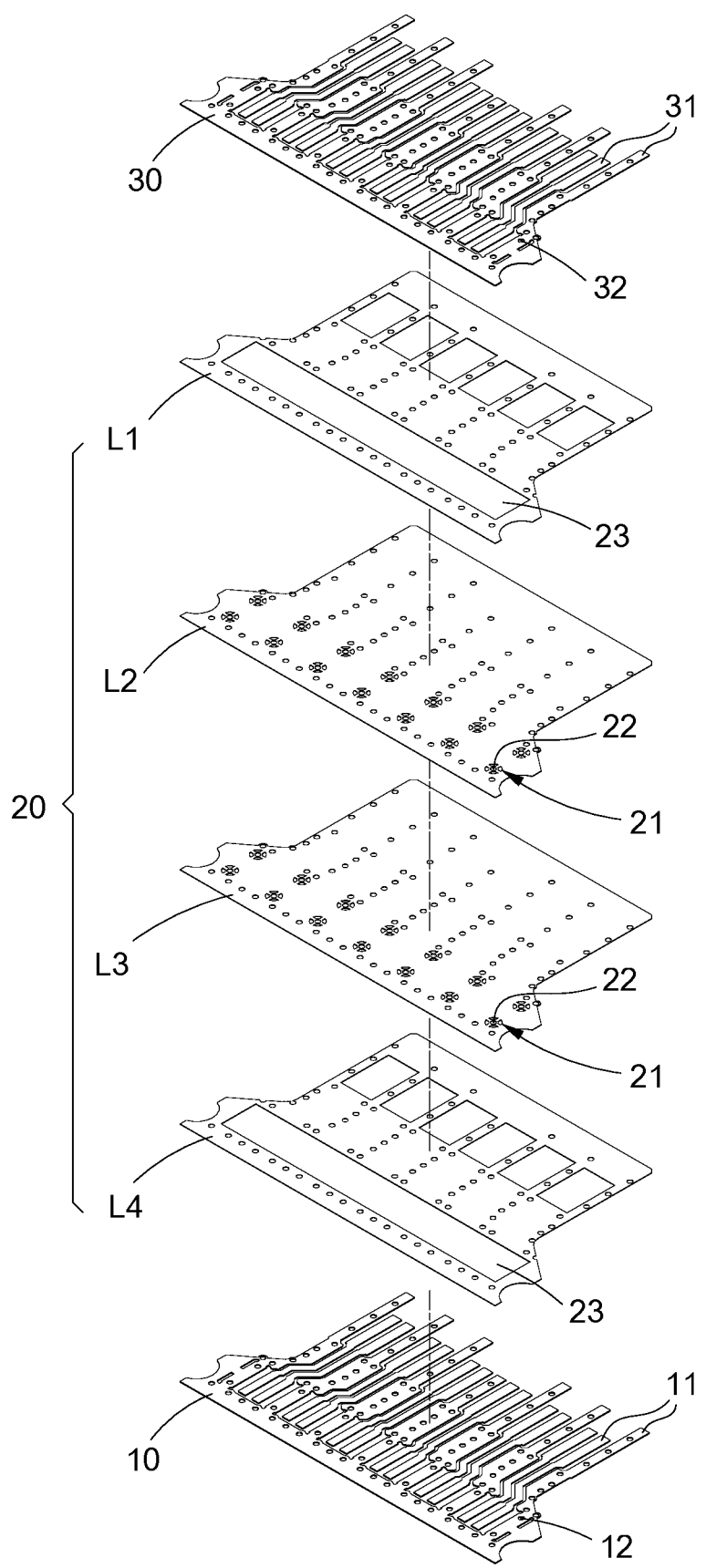
FIG. 1 is an exploded view of the first embodiment of the disclosure.
Figure 2:
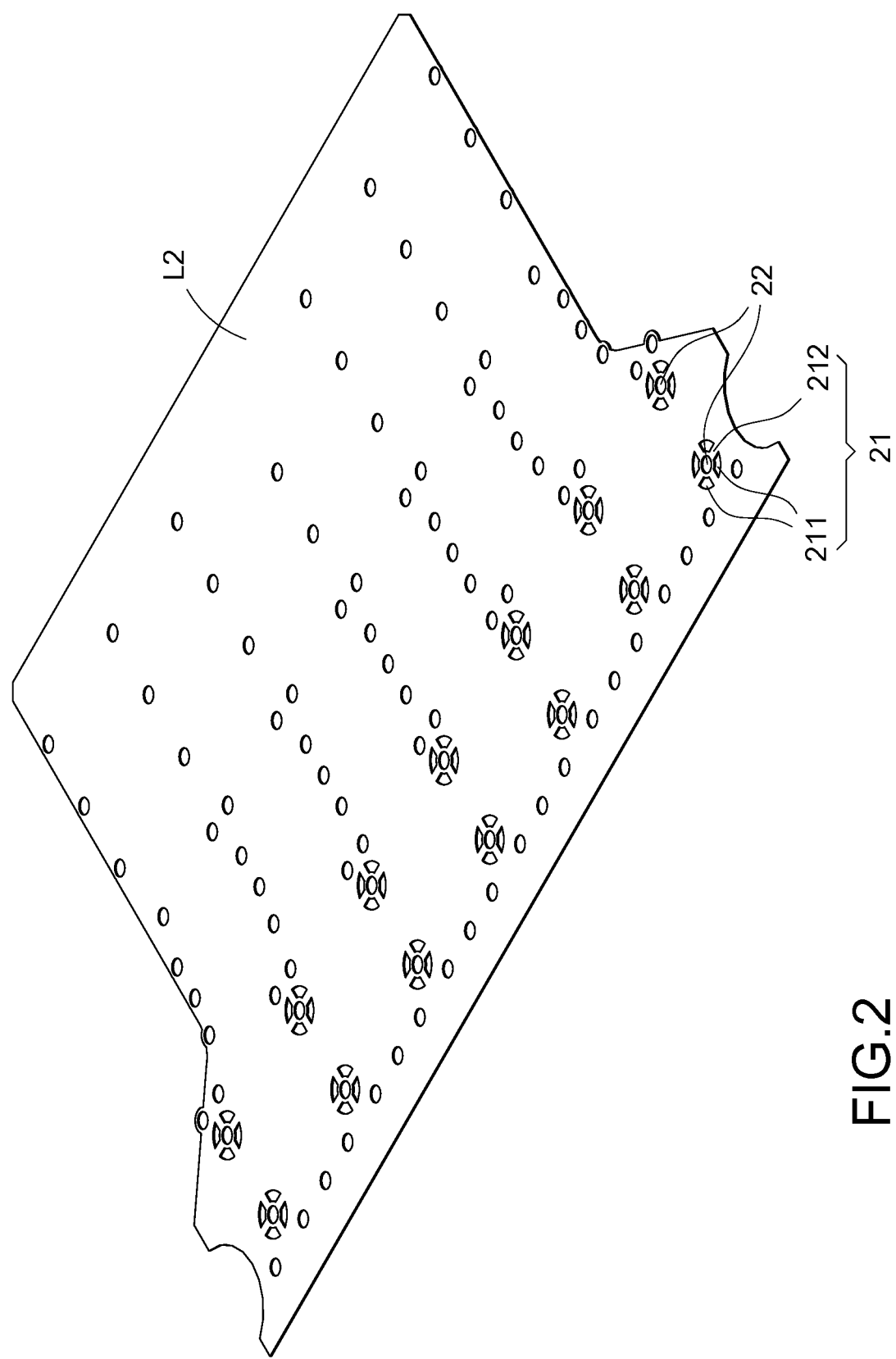
FIG. 2 is a perspective view of the middle metal layer of the first embodiment of the disclosure.

The technical contents of this disclosure will become apparent with the detailed description of embodiments accompanied with the illustration of related drawings as follows. It is intended that the embodiments and drawings disclosed herein are to be considered illustrative rather than restrictive.

Please refer to FIGS. 1-4. The disclosure provides a multi-layer printed circuit board, which includes a base-layer metal 10, multiple middle metal layers 20 and a top-layer metal 30.

The base-layer metal 10, each middle metal layer 20 and the top-layer metal 30 are made of, but not limited to, one of aluminum, steel, copper, and iron. In some embodiments, a metal layer made of aluminum, steel or iron may be further coated with copper foil to increase the conductive efficiency. A surface of the base-layer metal 10 and a surface of the top-layer metal 30 are respectively disposed with multiple metal pins 11, 31 for facilitating plugging/unplugging of a connector (not shown in figures).

In the embodiment, the middle metal layers 20 are, but not limited to, four in number. However, the number of the middle metal layers 20 may also be two, six, eight or more than ten in other embodiments. In detail, the middle metal layers 20 in the embodiment include a first middle metal layer L1, a second middle metal layer L2, a third middle metal layer L3 and a fourth middle metal layer L4. The middle metal layer 20 are stacked on the base-layer metal from top to bottom in order. The top-layer metal 30 is disposed on the middle metal layers 20. That is, the top-layer metal 30 and the base-layer metal 10 are located on the top side and the bottom side of the middle metal layers 20, respectively.

The base-layer metal 10, each middle metal layers 20 and the top-layer metal 30 are respectively formed with multiple through holes 12, 22, 32 to generate signal isolation to reduce the crosstalk interference between high-frequency signals. In the embodiment, at least two adjacent middle metal layers 20 are formed with multiple hole groups 21. That is, the middle metal layers 20, which are partially connected, are respectively formed with multiple hole groups 21 corresponding to the through holes 22, but not limited to this. Please refer to the second embodiment shown in FIG. 5, each hole group 21 may also be disposed on all of the middle metal layers 20. Please refer back to FIGS. 1-4, two of rest of the middle metal layers 20 in the embodiment are separately formed with a refuge hole 23 defined on the through holes 22 of the two middle metal layers 20. Also, the two middle metal layers 20 with the refuge holes 23 are separately adjacent to the base-layer metal 10 and the top-layer metal 30. In detail, each hole group 21 in the embodiment is disposed the second middle metal layer L2 and the third middle metal layer L3, and each refuge hole 23 is separately disposed on the first middle metal layer L1 and the fourth middle metal layer L4, but not limited to this.

Figure 9:
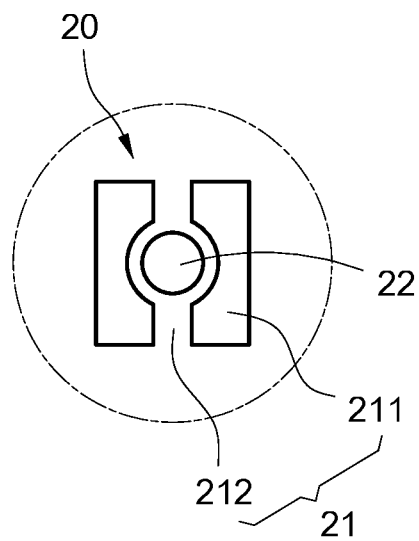
FIG. 9 is a top view of the hole group of the fifth embodiment of the disclosure.

Each hole group 21 includes multiple passing holes 211. The passing holes 211 jointly surround a corresponding one of the through holes 22 and multiple connecting channels 212 are disposed between the passing holes 211. In the embodiment, the passing holes 211 of each hole group 21 jointly surround a corresponding one of the through holes 22 to be arranged annularly, but not limited to this. The passing holes 211 may decrease the conductive area around the through holes 22 to reduce the cooling speed to avoid an excessively low temperature of a pad and to be advantageous to the subsequent soldering process. In the first embodiment of the disclosure, each passing hole 211 is of, but not limited, a substantially meniscoid shape. For example, each passing hole 211 may be of a substantially rectangular, triangular, oval, fan, or irregular shape. Each passing hole 211 with a rectangular shape is shown in FIG. 9. The triangular, oval, fan or irregular shape may be deduced accordingly and the figures are omitted here for brevity.

Figure 6:
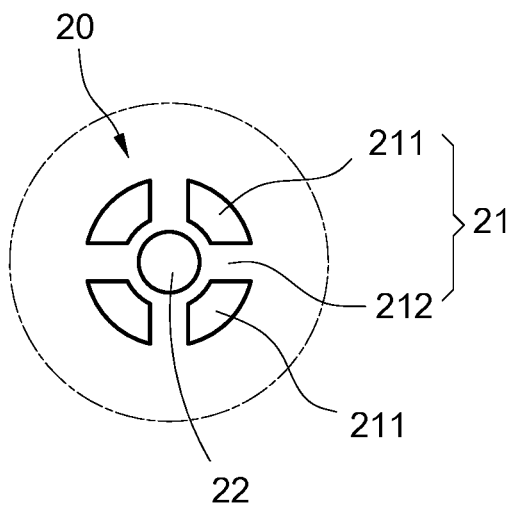
FIG. 6 is a top view of the hole group of the first embodiment of the disclosure.
Figure 7:
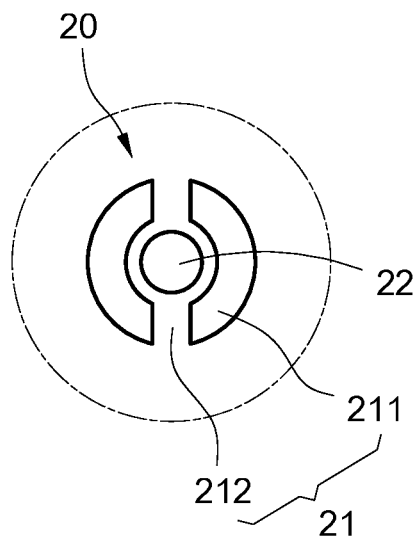
FIG. 7 is a top view of the hole group of the third embodiment of the disclosure.
Figure 8:
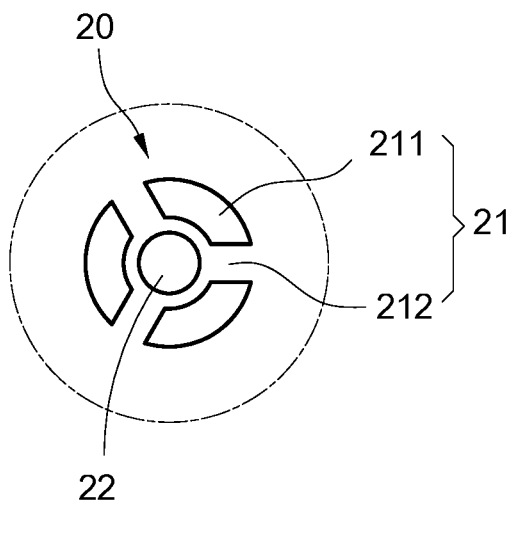
FIG. 8 is a top view of the hole group of the fourth embodiment of the disclosure.

Furthermore, the number of the connecting channels 212 depends upon the number of the passing holes 211. Please refer to FIG. 6, in each hole group 21 of the embodiment, the passing holes 211 are four in number and the connecting channels 212 are four in number, too, but not limited to this. Please refer to FIG. 7, which shows the third embodiment of the disclosure. The passing holes 211 in each hole group 21 are two in number and the connecting channels 212 are two in number, too. Please refer to FIG. 8, which shows the fourth embodiment of the disclosure. The passing holes 211 in each hole group 21 are three in number and the connecting channels 212 are three in number, too. Therefore, a designer may adjust the numbers of the passing holes 211 and the connecting channels 212 of the hole group 21 depending on a required cooling speed so as to increase or decrease the cooling speed around the through holes 12, 22, 32.

Figure 3:
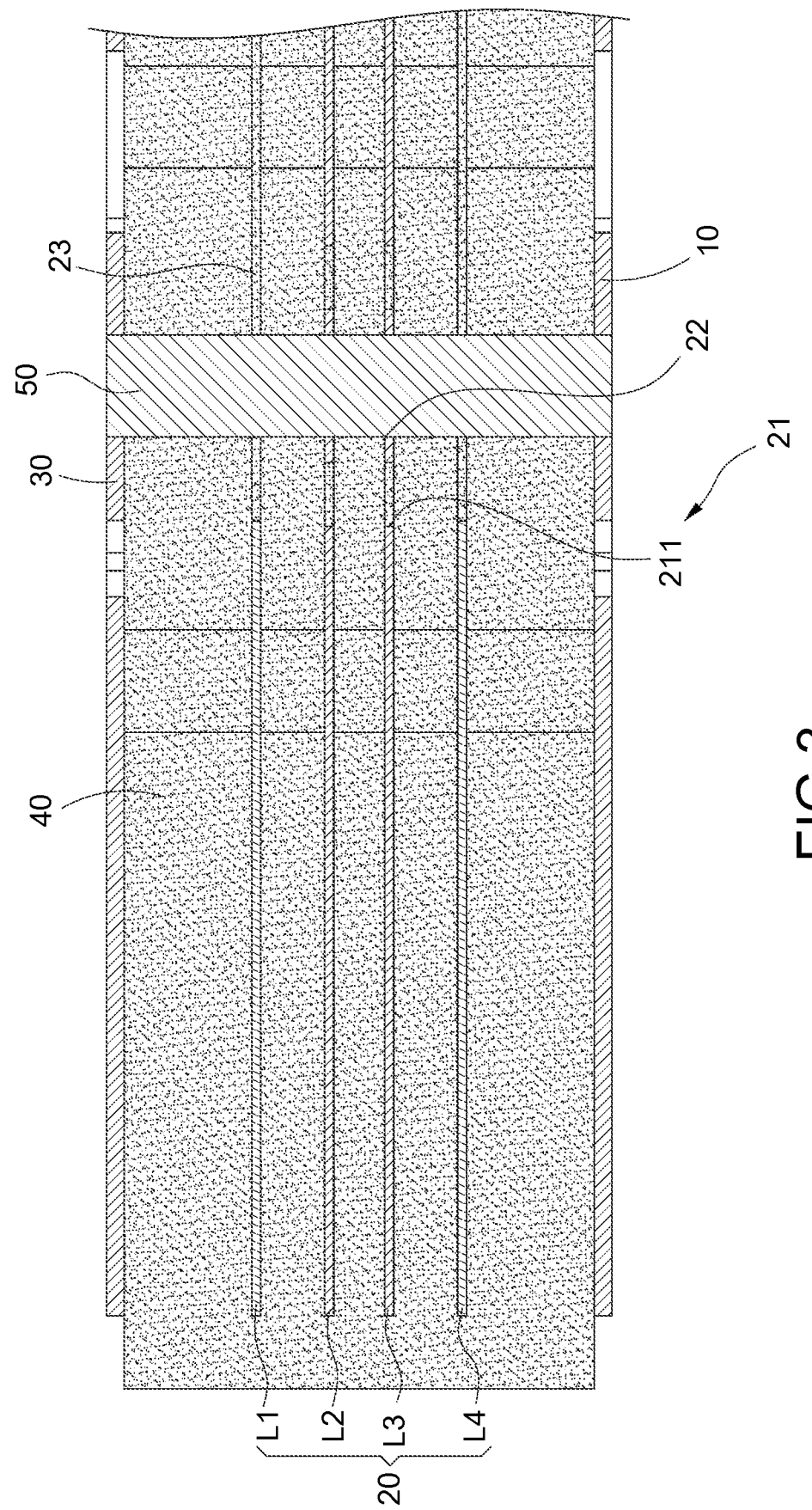
FIG. 3 is a cross-sectional view of the first embodiment of the disclosure.
Figure 4:
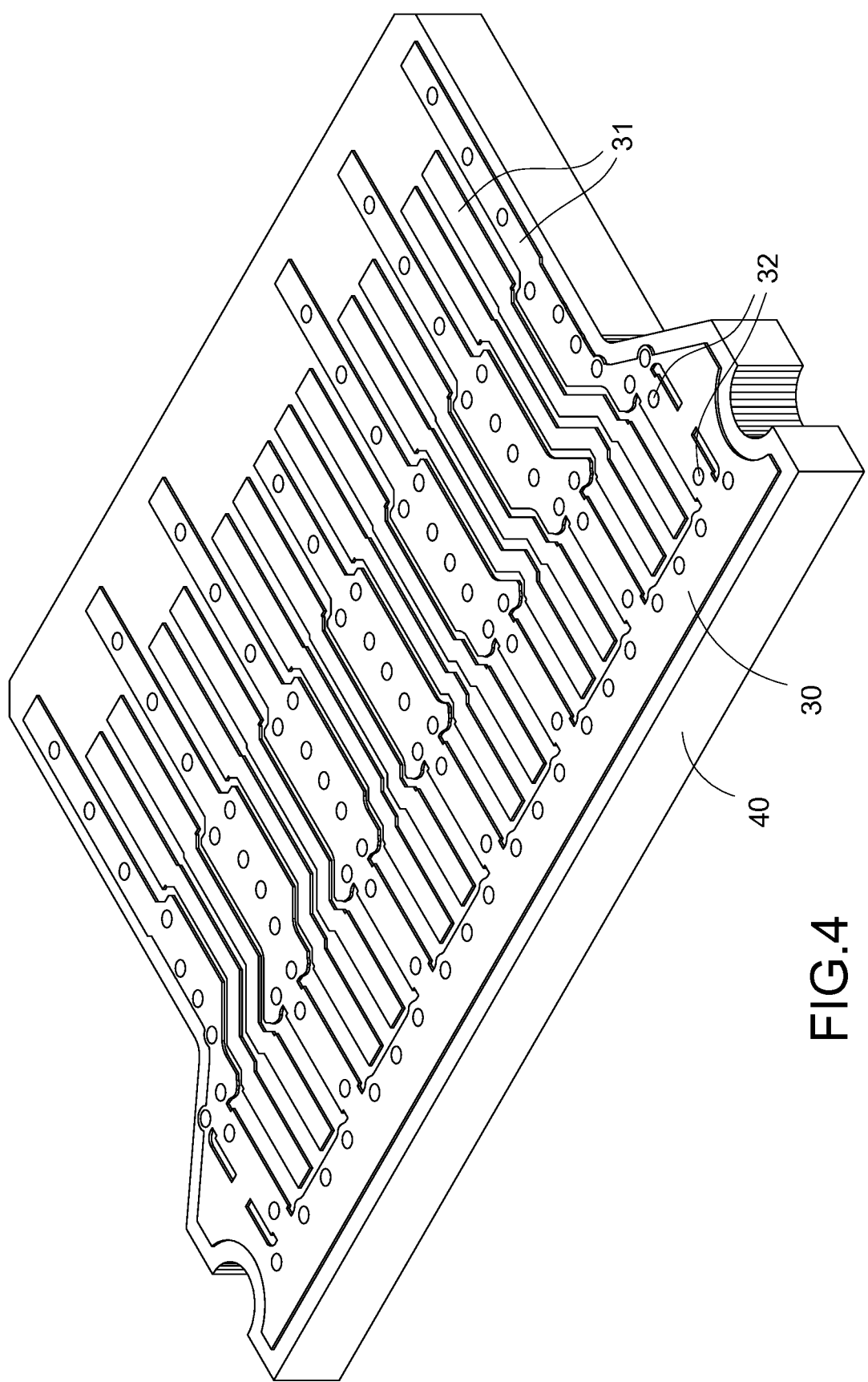
FIG. 4 is a perspective view of the first embodiment of the disclosure.
Figure 5:
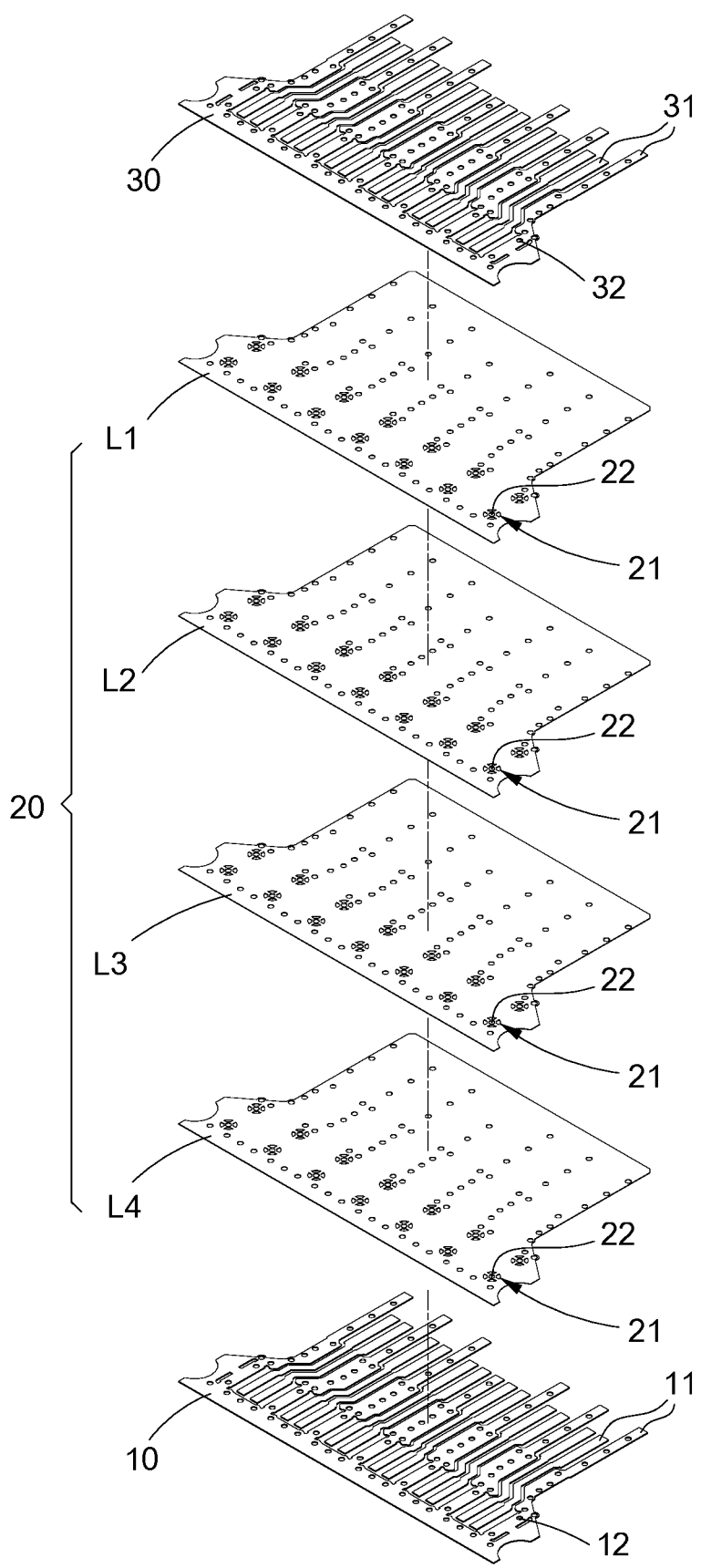
FIG. 5 is an exploded view of the second embodiment of the disclosure.

Please refer to FIGS. 3 and 4, the multi-layer printed circuit board of the disclosure further includes a substrate 40 and multiple conductive copper pillars 50. In the embodiment, the substrate 40 is made of plastic or other insulative materials by injection molding, but not limited to this. The substrate 40 covers the middle metal layers 20, and is connected with the base-layer metal 10 and the top-layer metal 30 and separates the base-layer metal 10, each middle metal layer 20 and the top-layer metal 30 to prevent each metal layer from forming electric connection. Each conductive copper pillar 50 is disposed in each though hole 12, 22, 32 and covered by the substrate 40, and each conductive copper pillar 50 separately forms electric connection with the base-layer metal 10, the top-layer metal 30 and the middle metal layers 20 with the hole groups 21 so as to make each metal pin 11, 31 of both the base-layer metal 10 and the top-layer metal 30 and the copper foil in the multi-player printed circuit board form electric conduction.

While this disclosure has been described by means of specific embodiments, numerous modifications and variations could be made thereto by those skilled in the art without departing from the scope and spirit of this disclosure set forth in the claims.

What is claimed is:

1. A multi-layer printed circuit board comprising:
a base-layer metal;
multiple middle metal layers, stacked on the base-layer metal sequentially; and
a top-layer metal, disposed on the middle metal layers;
wherein the base-layer metal, each middle metal layer and the top-layer metal respectively comprise multiple through holes, two of the multiple middle metal layers respectively adjacent to the base-layer metal and the top-layer metal each comprises a refuge hole covering the multiple through holes of the two of the multiple middle metal layers, others of the multiple middle metal layers separately comprise multiple hole groups corresponding to the multiple through holes, each hole group comprises multiple passing holes, and the multiple passing holes jointly surround a corresponding one of the multiple through holes and multiple connecting channels are disposed between the multiple passing holes correspondingly.

2. The multi-layer printed circuit board of claim 1, wherein at least two middle metal layers comprise the multiple hole groups.

3. The multi-layer printed circuit board of claim 1, wherein each middle metal layer comprises the hole groups.

4. The multi-layer printed circuit board of claim 1, wherein each passing hole is of a substantially meniscoid shape or a rectangular shape.

5. The multi-layer printed circuit board of claim 1, wherein the multiple passing holes of each hole group surrounds one of the multiple through holes to be arranged annularly.

6. The multi-layer printed circuit board of claim 5, wherein the passing holes of each hole group are two in number, and the connecting channels are two in number.

7. The multi-layer printed circuit board of claim 5, wherein the passing holes of each hole group are three in number, and the connecting channels are three in number.

8. The multi-layer printed circuit board of claim 5, wherein the multiple passing holes of each hole group are four in number, and the multiple connecting channels are four in number.

9. The multi-layer printed circuit board of claim 1, further comprising multiple conductive copper pillars, wherein each conductive copper pillar is disposed in each though hole, and each conductive copper pillar is electrically connected with the base-layer metal, the top-layer metal, and the others of the multiple middle metal layers.

* * * * *